US012764902B2

(12) United States Patent
Li et al.

(10) Patent No.: US 12,764,902 B2
(45) Date of Patent: Oct. 13, 2026

(54) FLUID HEAT DISSIPATION DEVICE

(71) Applicant: Auras Technology Co., Ltd., New Taipei City (TW)

(72) Inventors: Chia-Hung Li, New Taipei City (TW); Chun-Chi Lai, New Taipei City (TW); Chien-Yu Chen, New Taipei City (TW)

(73) Assignee: AURAS TECHNOLOGY CO., LTD., New Taipei City (TW)

( * ) Notice: Subject to any disclaimer, the term of this patent is extended or adjusted under 35 U.S.C. 154(b) by 221 days.

(21) Appl. No.: 18/647,465

(22) Filed: Apr. 26, 2024

(65) Prior Publication Data

US 2024/0365507 A1 Oct. 31, 2024

Related U.S. Application Data

(60) Provisional application No. 63/462,108, filed on Apr. 26, 2023.

(30) Foreign Application Priority Data

Nov. 28, 2023 (TW) ................................ 112146014

(51) Int. Cl.
*H05K 7/20* (2006.01)

(52) U.S. Cl.
CPC ..... *H05K 7/20272* (2013.01); *H05K 7/20254* (2013.01); *H05K 7/20218* (2013.01)

(58) Field of Classification Search
CPC ........... H05K 7/20272; H05K 7/20254; H05K 7/20218
USPC ............................................ 165/144, 104.33
See application file for complete search history.

(56) References Cited

U.S. PATENT DOCUMENTS

| | | | | |
|---|---|---|---|---|
| 6,189,602 | B1 * | 2/2001 | Tanahashi | G06F 1/203 361/679.55 |
| 11,452,237 | B2 * | 9/2022 | Tan | H05K 7/20272 |
| 12,092,241 | B2 * | 9/2024 | Hamadate | F25B 41/24 |
| 2011/0214445 | A1 * | 9/2011 | Han | F16L 59/18 285/343 |
| 2015/0109728 | A1 * | 4/2015 | Campbell | H05K 7/20336 361/679.47 |
| 2016/0242318 | A1 * | 8/2016 | Krug, Jr. | H05K 7/20218 |
| 2022/0210949 | A1 * | 6/2022 | Edmunds | H05K 7/20254 |
| 2022/0243847 | A1 * | 8/2022 | Ohno | F16L 41/03 |

* cited by examiner

*Primary Examiner* — Joel M Attey
(74) *Attorney, Agent, or Firm* — MUNCY, GEISSLER, OLDS & LOWE, P.C.

(57) ABSTRACT

A fluid heat dissipation device includes a first cold plate, a first adapter and a fluid delivery pipeline. The first cold plate is used to cool a first heat source, the first adapter is connected to the first cold plate, and the fluid delivery pipeline is connected to the first adapter and fluidly communicated with the first cold plate to improve the production efficiency and quality of the fluid heat dissipation device.

16 Claims, 5 Drawing Sheets

FLUID HEAT DISSIPATION DEVICE

RELATED APPLICATIONS

This application claims priorities to U.S. Provisional Application Ser. No. 63/462,108, filed Apr. 26, 2023 and Taiwan Application Serial Number 112146014, filed Nov. 28, 2023, the disclosures of which are incorporated herein by reference in their entireties.

TECHNICAL FIELD

The present disclosure generally relates to a heat dissipation device. More particularly, the present disclosure relates to a fluid heat dissipation device.

BACKGROUND

With the advancement of technology, electronic products have become more popular, and gradually changed the life or work of many people. As the calculating power of the computers increases, the temperature control of the electronic components such as the central processing units and memories is more important.

Electronic components such as the central processing units and memories generate heat during operation and require proper cooling to achieve the best performance. In order to keep the electronic components such as the central processing units and memories operating at a proper temperature, fluid cooling devices or air cooling devices are usually used.

With the current water-cooled heat dissipation device, the working fluid flows into the cold plate through the pipeline, and the cold plate can effectively take away the heat generated by the working electronic components such as the central processing unit and memory. Therefore, the current water-cooled heat dissipation device may reduce the working temperature of electronic components such as the central processing unit and memory to improve the working efficiency of electronic components.

However, since the cold plate and fluid delivery pipelines of the central processing unit and memory may be made of the same or different metal materials according to the heat dissipation and strength requirements. Therefore, the integration of the cold plate and the fluid delivery pipelines of the fluid cooling device may increase the complexity of the manufacturing process. Accordingly, there is a need to improve the manufacturing convenience of the fluid heat dissipation device and further improve the manufacturing efficiency of the electronic equipment.

SUMMARY

One objective of the embodiments of the present invention is to provide a fluid heat dissipation device to improve the manufacturing convenience of the heat dissipation device and improve the heat dissipation efficiency of the heat dissipation device.

To achieve these and other advantages and in accordance with the objective of the embodiments of the present invention, as the embodiment broadly describes herein, the embodiments of the present invention provides a fluid heat dissipation device including a first cold plate, a first adapter and a fluid delivery pipeline. The first cold plate is utilized to cool a first heat source, the first adapter is connected to the first cold plate and the fluid delivery pipeline is connected to the first adapter and fluidly communicated with the first cold plate.

In some embodiments, the first adapter includes a first joint and a second joint. The first joint is connected to the fluid delivery pipeline and the second joint is connected to the first cold plate. In addition, the first joint and the second joint are integrally formed.

In some embodiments, the first joint and the second joint are formed by different materials, the first joint and the fluid delivery pipeline are formed by a same material, and the second joint and the first cold plate are formed by another same material.

In some embodiments, the second joint is formed by copper metal powders and the first joint is formed by non-copper metal powders.

In some embodiments, the first joint and the second joint are integrally formed by a metal injection molding process.

In some embodiments, the fluid heat dissipation device further includes a first water collector and a first fluid delivery pipeline. The first water collector is connected to the fluid delivery pipeline and the first fluid delivery pipeline is connected to the first water collector.

In some embodiments, the fluid heat dissipation device further includes a second adapter and a third fluid delivery pipeline. The second adapter is connected to the first cold plate and the third fluid delivery pipeline is connected to the second adapter. In addition, the second adapter is a composite metal adapter.

In some embodiments, the fluid heat dissipation device further includes a first water cooling module connected to the third fluid delivery pipeline to cool a second heat source. In addition, the first water cooling module includes a second water collector, a third water collector and a plurality of second cold plates. The second water collector is connected to the third fluid delivery pipeline, and the plurality of second cold plates are connected in parallel between the second water collector and the third water collector to cool the second heat source.

In some embodiments, the fluid heat dissipation device includes a second water cooling module and a fourth fluid delivery pipeline. The fourth fluid delivery pipeline is connected between the second water cooling module and the first water cooling module. In addition, the second water cooling module includes a fourth water collector, a fifth water collector and a plurality of third cold plates. The fourth fluid delivery pipeline is connected to the fourth water collector and the third water collector, and the plurality of third cold plates are connected in parallel between the fourth water collector and the fifth water collector to cool a third heat source.

In some embodiments, the fluid heat dissipation device further includes a fifth fluid delivery pipeline connected to the fifth water collector.

In some embodiments, the fluid heat dissipation device further includes a sixth fluid delivery pipeline, a third adapter and a fourth cold plate. The sixth fluid delivery pipeline is connected to the first water collector, and the third adapter is connected to the sixth fluid delivery pipeline. In addition, the third adapter is a composite metal adapter, and the fourth cold plate is connected to the third adapter to cool a fourth heat source.

In some embodiments, the fluid heat dissipation device further includes a fourth adapter and a seventh fluid delivery pipeline. The fourth adapter is connected to the fourth cold plate. In addition, the fourth adapter is a composite metal adapter and the seventh fluid delivery pipeline is connected to the fourth adapter.

In some embodiments, the fluid heat dissipation device further includes a third water cooling module connected to the seventh fluid delivery pipeline. In addition, the third water cooling module includes a sixth water collector, a seventh water collector and a plurality of fifth cold plates. The sixth water collector is connected to the seventh fluid delivery pipeline and the plurality of fifth cold plates are connected in parallel between the sixth water collector and the seventh water collector to cool a fifth heat source.

In some embodiments, the fluid heat dissipation device further includes an eighth fluid delivery pipeline connected to the seventh water collector of the third water cooling module and the fourth water collector of the second water cooling module.

In some embodiments, the first joint of the first adapter includes a flange and a stop surface. The stop surface is disposed in the flange, and the fluid delivery pipeline is welded to the flange through laser welding and positioned on the stop surface, and the first adapter is welded to a connecting port of the first cold plate through laser welding.

In some embodiments, the second cold plates are integrally formed by metal injection molding with metal powders and connected to the second water collector and the third water collector through laser welding.

In some embodiments, each second cold plate includes a first end surface, a second end surface, a third end surface, a fourth end surface and a plurality of partition plates. The first end surface, the second end surface, the third end surface and the fourth end surface are formed a heat exchange chamber, an inlet and an outlet. In addition, the partition plates are formed in the heat exchange chamber to form a plurality of flowing channels in parallel.

In some embodiments, the first cold plate includes an upper cover and a lower cover connected to the upper cover through laser welding.

Hence, the fluid heat dissipation device may use an adapter to directly connect and communicate the fluid delivery pipelines and cold plates made of different materials without using solder, thereby effectively improving the manufacturing efficiency, product quality and heat dissipation efficiency of the fluid heat dissipation device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

Figure 1:
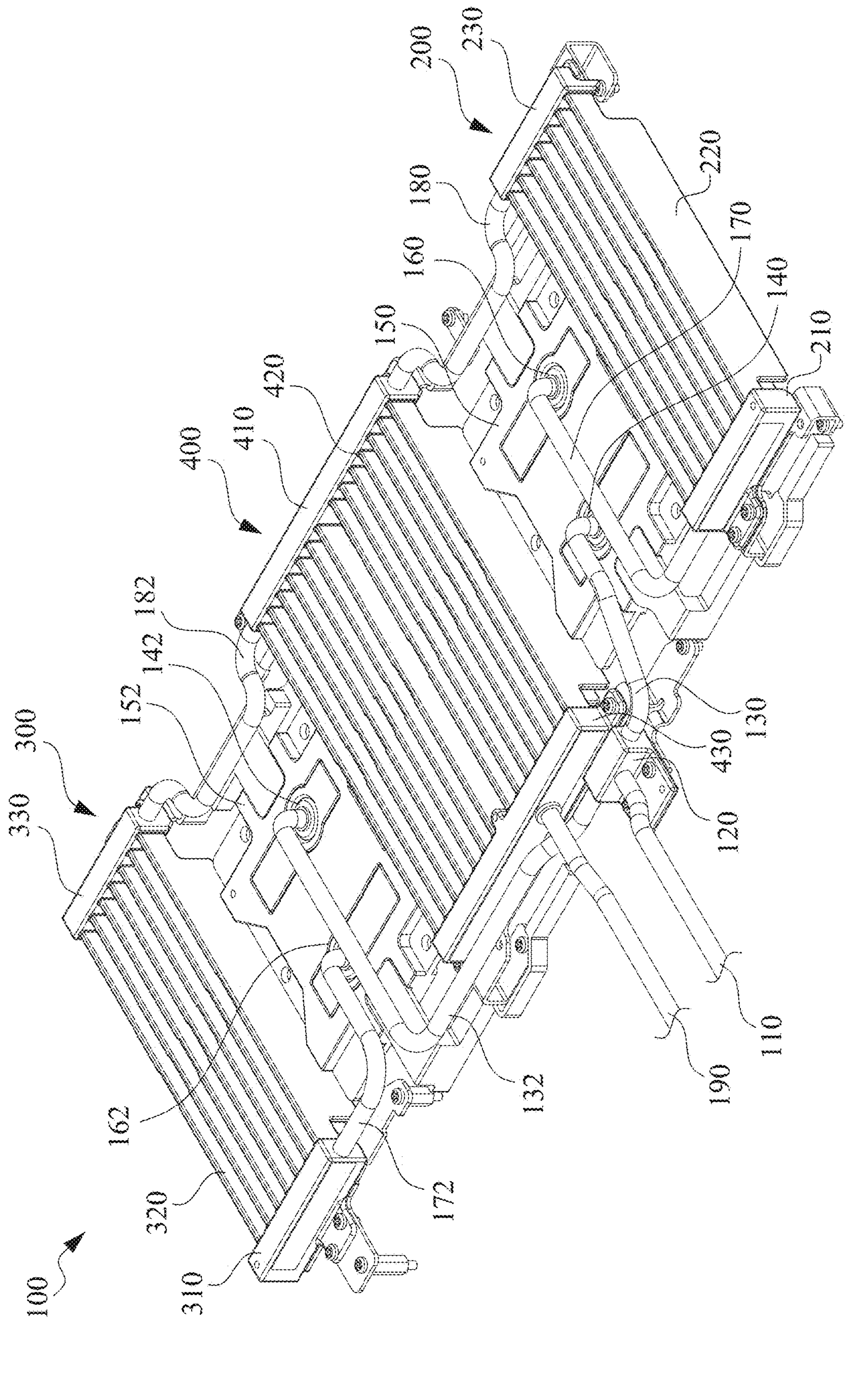
FIG. 1 illustrates a schematic perspective view showing a fluid heat dissipation device according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
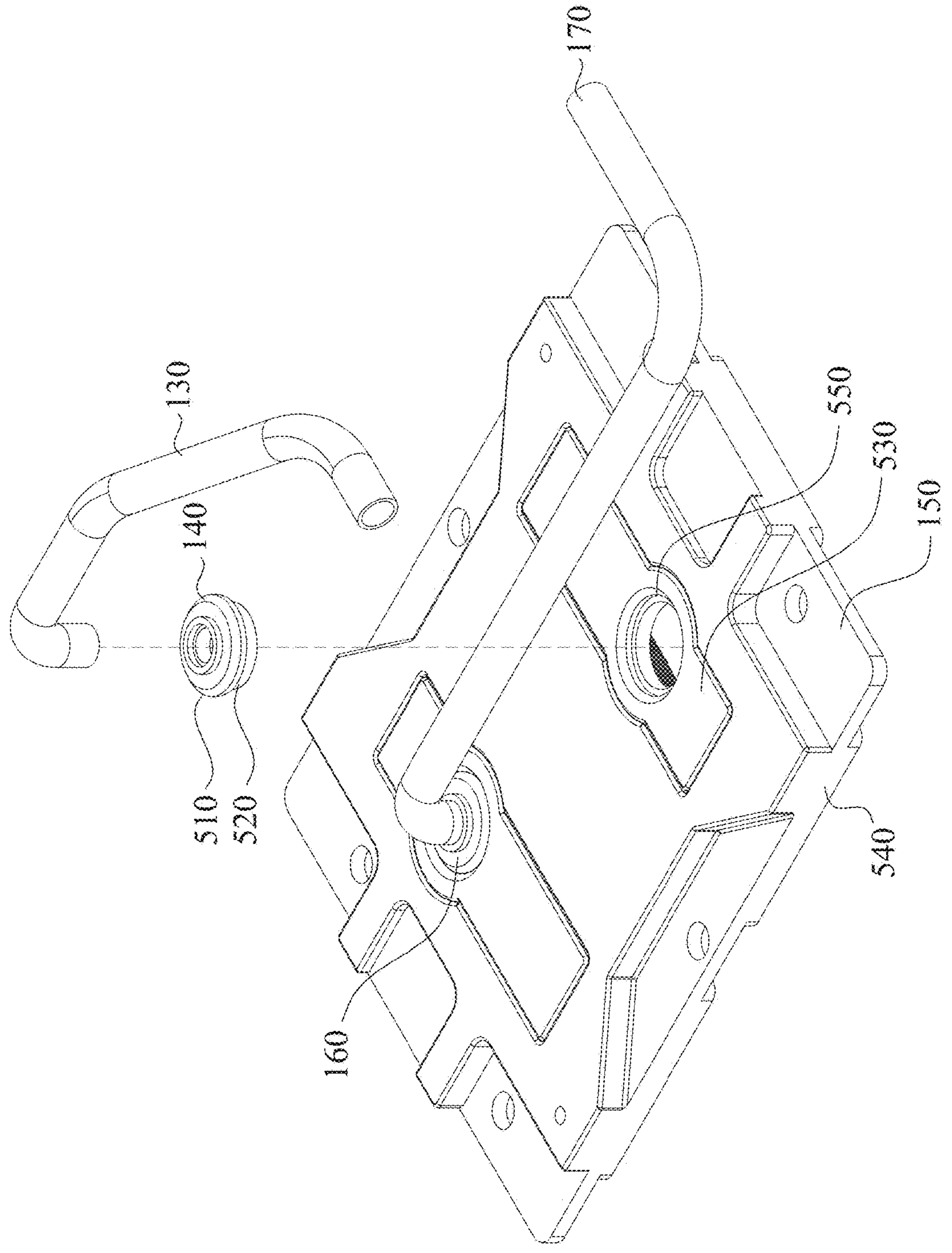
FIG. 2 illustrates a schematic perspective view showing a cold plate of the fluid heat dissipation device of FIG. 1.
Figure 3:
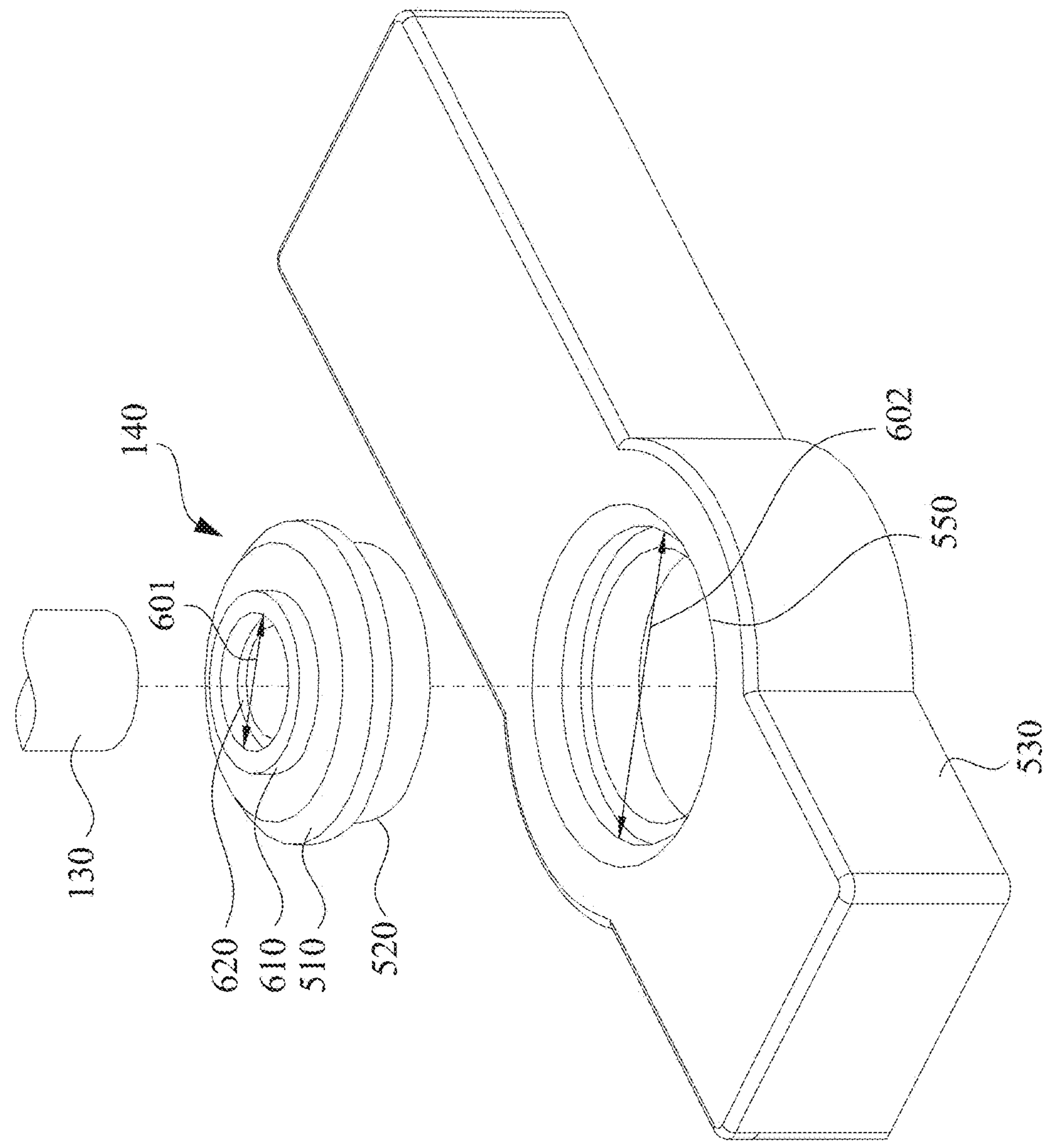
FIG. 3 illustrates a schematic perspective view showing an adapter of the fluid heat dissipation device of FIG. 1.
Figure 4:
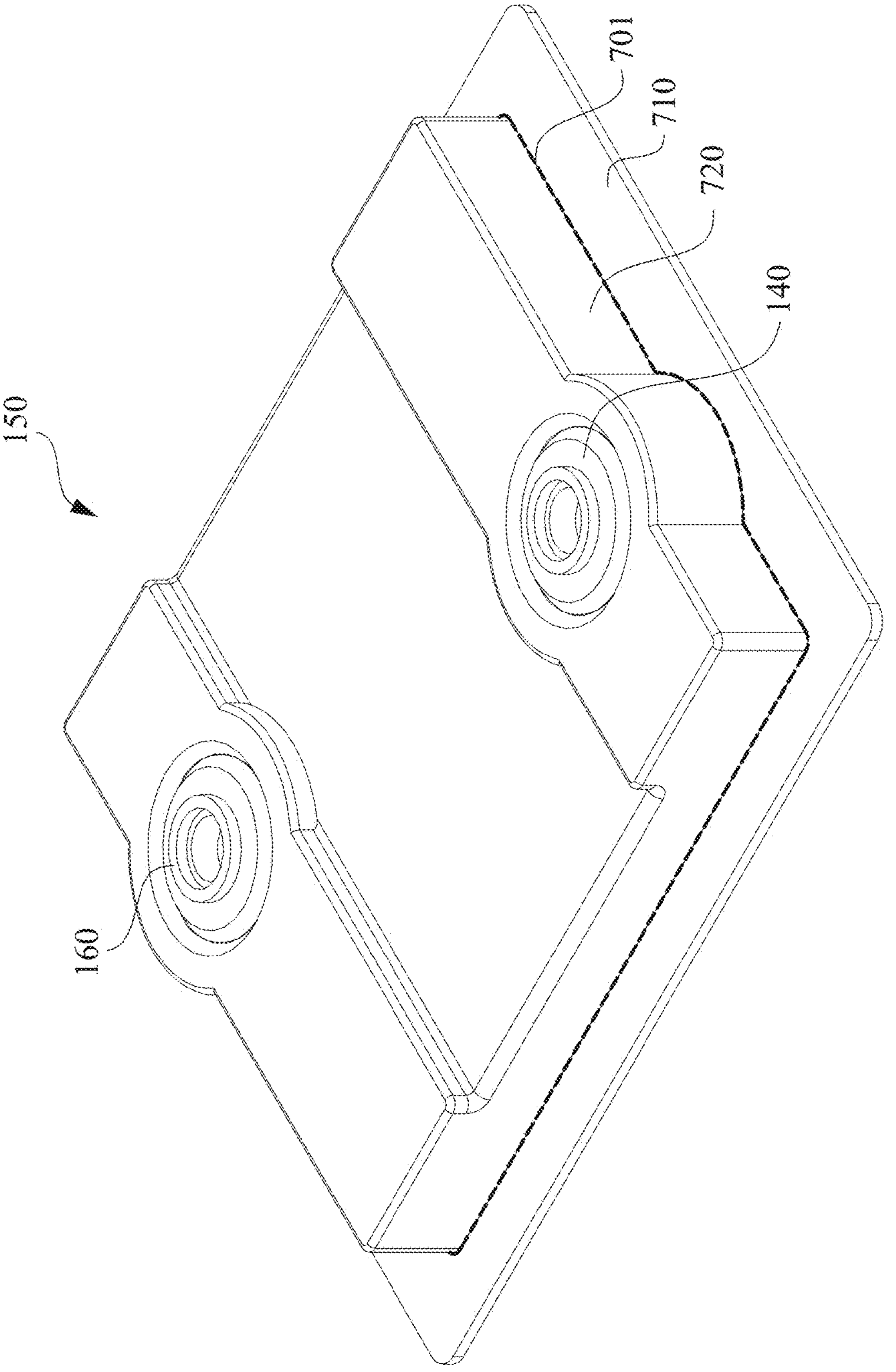
FIG. 4 illustrates a schematic perspective view showing a first cold plate of the fluid heat dissipation device of FIG. 1.
Figure 5:
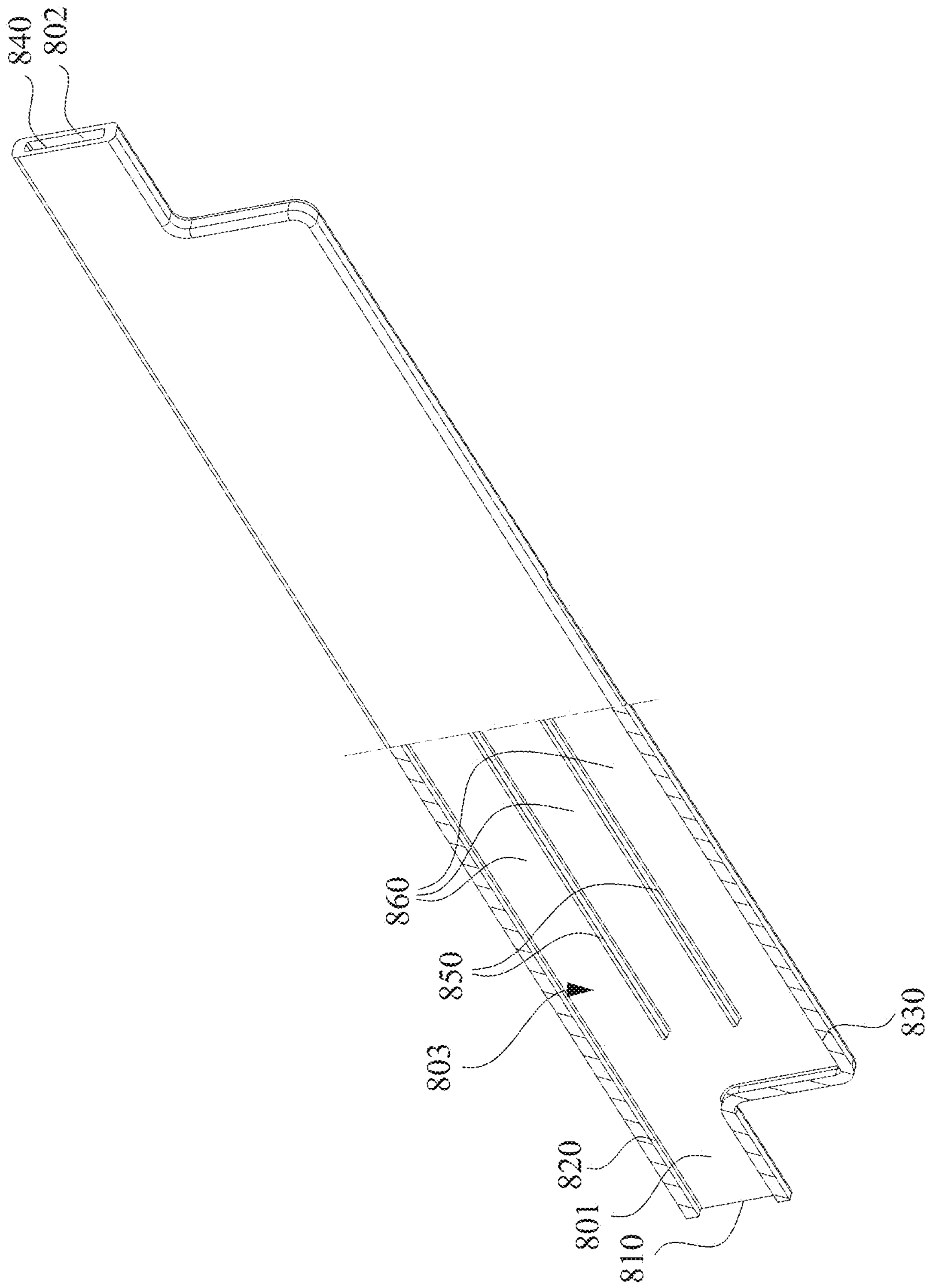
FIG. 5 illustrates a schematic perspective view showing a second cold plate of the fluid heat dissipation device of FIG. 1.

FIG. 1 is a schematic perspective view showing a fluid heat dissipation device according to one embodiment of the present invention, FIG. 2 is a cold plate of the fluid heat dissipation device, FIG. 3 is an adapter of the fluid heat dissipation device, FIG. 4 is a first cold plate of the fluid heat dissipation device, and FIG. 5 is a second cold plate of the fluid heat dissipation device.

Referring to FIG. 1, the fluid heat dissipation device 100 includes a first cold plate 150, a first adapter 140 and a fluid delivery pipeline, for example, the second fluid delivery pipeline 130 in the drawing is illustrated as an exemplary embodiment, but not limited to this.

The first cold plate 150 is used to cool a first heat source, for example, a central processing unit or any heat-generating electronic device, without departing from the spirit and scope of the present invention. The first adapter 140 is connected to the first cold plate 150, and the second fluid delivery pipeline 130 is connected to the first adapter 140 and fluidly communicated with the first cold plate 150.

In some embodiments, the first cold plate 150 includes an upper cover 720 and a lower cover 710. The lower cover 710 is connected to the upper cover 720 by laser welding, referring to the laser welding path 701 illustrated as the dashed line in FIG. 4.

Simultaneously referring to FIG. 2, a first adapter 140 is illustrated as an exemplary embodiment. The first adapter 140 includes a first joint 510 and a second joint 520. The first joint 510 is utilized to connect to the second fluid delivery pipeline 130, and the second joint 520 is utilized to connect to a connecting port 550 of the first cold plate 150 to provide a required cooling fluid to the first cold plate 150.

In some embodiments, the first joint 510 and the second joint 520 are integrally formed.

In some embodiments, the first joint 510 and the second joint 520 are made of different materials. In some embodiments, the second joint 520 is formed by copper metal powders, and the first joint 510 is formed by non-copper metal powders, for example, aluminum metal powders or stainless steel metal powders, but not limited to this. In some embodiments, the second joint 520 may be made of non-copper metal powders, for example, aluminum metal powders or stainless steel metal powders, and the first joint 510 may be made of copper metal powders, but not limited to this.

In some embodiments, the first joint 510 and the fluid delivery pipeline are made of the same material, and the second joint 520 and the first cold plate 150 are made of the same material.

In some embodiments, the first joint 510 and the second joint 520 are integrally formed by metal injection molding (MIM) to form a composite metal adapter, for example, a bimetal adapter.

Therefore, the composite metal adapter may be welded to the aluminum, copper or stainless steel cold plate by laser welding as well as the aluminum, copper or stainless steel fluid delivery pipeline by laser welding. In addition, when the cold plate and the fluid delivery pipeline are made of different materials, there is no need to rely on solder or electroplating layer for laser welding and the laser welding only heats a local area to avoid a chamber thermal deformation during the laser welding process so as to manufacture a smaller or thinner chamber without solder to avoid the problem of solder clogging.

In addition, a composite metal adapter having a copper bottom and a stainless steel or aluminum top may be manufactured by the MIM process to form a welding adapter for connecting to different materials. In some embodiments, when the cold plate main body 530 of the first cold plate 150 is made of cooper and the second fluid delivery pipeline 130 is made of aluminum, the bimetal adapter may directly connect the second fluid delivery pipeline 130 on the first joint 510 of the first adapter 140 by laser welding, and the connecting port 550 of the cold plate main body 530 of the first cold plate 150 is connected to the second joint 520 of the first adapter 140 by laser welding to fluidly communicate the first cold plate 150 and the second fluid delivery pipeline 130. Utilizing a plurality of metal materials to form adapters to connect pipes and components made of different materials may ensure that all welding processes are homogeneous metal welding without relying on additional electroplating layer or solder, thereby improving welding stability and product quality of the fluid heat dissipation device 100, for example, improving the structural strength of the welding joint to avoid the problem of liquid leakage caused by insufficient structural strength of the welding joint. In addition, the composite metal adapter, such as a bimetal adapter, is made of a plurality of metal materials to effectively connect two heterogeneous metal components, and not limited to pipes or cold plates. The composite metal adapter may also be used in the connection and communication of any components of the fluid heat dissipation device 100 to laser weld the inside or outside of pipelines, cold plates and heat dissipation devices, without departing from the spirit and scope of the present invention.

In some embodiments, the first cold plate 150 further includes a cold plate fixing frame 540 to fix on the outside of the cold plate main body 530 to fix the first cold plate 150 on a circuit board so as to enable the first cold plate 150 contacting the first heat source.

Referring to FIG. 1, the fluid heat dissipation device 100 further includes a first water collector 120 and a first fluid delivery pipeline 110. The first water collector 120 is connected to the second fluid delivery pipeline 130, and the first fluid delivery pipeline 110 is connected to the first water collector 120.

In some embodiments, the first water collector 120 may be a water collecting chamber to receive the cooling fluid from the first fluid delivery pipeline 110 and then distribute the cooling fluid to the second fluid delivery pipeline 130 and/or the sixth fluid delivery pipeline 132, but not limited to this.

In some embodiments, the fluid heat dissipation device 100 further includes a second adapter 160 and a third fluid delivery pipeline 170. The second adapter 160 is connected to the first cold plate 150, the second adapter 160 is preferably a composite metal adapter, e.g. a bimetal adapter, and the third fluid delivery pipeline 170 is connected to another end of the second adapter 160.

In some embodiments, the fluid heat dissipation device 100 further includes a first water cooling module 200 connected to the third fluid delivery pipeline 170 to cool a second heat source, for example, a memory card or any heat source standing on the circuit board. The first water cooling module 200 includes a second water collector 210, a plurality of second cold plates 220 and a third water collector 230. The second water collector 210 is connected to the third fluid delivery pipeline 170, and the second cold plates 220 are connected in parallel between the second water collector 210 and the third water collector 230 to allow the cooling fluid flowing from the second water collector 210 to the second cold plates 220, and then flowing to the third water collector 230 to cool a second heat source located between the second cold plates 220.

In some embodiments, the second cold plate 220 is illustrated as an exemplary embodiment. Referring to FIG. 5, the second cold plate 220 includes a first end surface 810, a second end surface 820, a third end surface 830, a fourth end surface 840 and a plurality of partition plates 850. The first end surface 810 is connected to the second end surface 820 and the third end surface 830, and the fourth end surface 840 is connected between the second end surface 820 and the third end surface 830, and the first end surface 810 is opposite to the fourth end surface 840 and the second end surface 820 is opposite to the third end surface 830 to form a heat exchange chamber 803, and an inlet 801 and an outlet 802 located on both sides of the heat exchange chamber 803. The cooling fluid enters the heat exchange chamber 803 through the inlet 801 to exchange the heat and exits the heat exchange chamber 803 through the outlet 802. In addition, a plurality of partition plates 850 are formed in the heat exchange chamber 803, for example, the plurality of partition plates 850 are formed in the heat exchange chamber 803 in parallel to form a plurality of flowing channels 860 in parallel in the heat exchange chamber 803 to cool the second heat source.

In some embodiments, the fluid heat dissipation device 100 further includes a second water cooling module 400 and a fourth fluid delivery pipeline 180. The fourth fluid delivery pipeline 180 is connected between the second water cooling module 400 and the first water cooling module 200. In addition, the second water cooling module 400 includes a fourth water collector 410, a plurality of third cold plates 420 and a fifth water collector 430. The third cold plates 420 are connected in parallel between the fourth water collector 410 and the fifth water collector 430 to cool a third heat source, for example, a memory card or any heat source standing on the circuit board. In addition, the fourth fluid delivery pipeline 180 is connected to the fourth water collector 410 and the third water collector 230.

In some embodiments, the fluid heat dissipation device 100 further includes a fifth fluid delivery pipeline 190 connected to the fifth water collector 430. In addition, the fifth fluid delivery pipeline 190 may be an output pipeline of the cooling liquid, but not limited to this.

In some embodiments, the fluid heat dissipation device 100 further includes a sixth fluid delivery pipeline 132, a third adapter 142 and a fourth cold plate 152. The sixth fluid delivery pipeline 132 is also connected to the first water collector 120, the third adapter 142 is connected to the sixth fluid delivery pipeline 132, and the fourth cold plate 152 is connected to the third adapter 142 to cool a fourth heat source, for example, a central processing unit or any other heat source, without departing from the spirit and scope of the present invention. In addition, the third adapter 142 is preferably a composite metal adapter, for example, a bimetal adapter.

In some embodiments, the fluid heat dissipation device 100 further includes a fourth adapter 162 connected to the fourth cold plate 152. In addition, the fourth adapter 162 is preferably a composite metal adapter, for example, a bimetal adapter.

In some embodiments, the fluid heat dissipation device 100 further includes a seventh fluid delivery pipeline 172 connected to the fourth adapter 162.

In some embodiments, the fluid heat dissipation device 100 further includes a third water cooling module 300 connected to the seventh fluid delivery pipeline 172. In addition, the third water cooling module 300 includes a sixth water collector 310, a plurality of fifth cold plates 320 and a seventh water collector 330. The sixth water collector 310 is connected to the seventh fluid delivery pipeline 172, and the fifth cold plates 320 is connected in parallel between the sixth water collector 310 and the seventh water collector 330 to cool a fifth heat source, for example a memory card or any heat source standing on the circuit board.

In some embodiments, the fluid heat dissipation device 100 further includes an eighth fluid delivery pipeline 182 connected between the seventh water collector 330 of the third water cooling module 300 and the fourth water collector 410 of the second water cooling module 400.

In some embodiments, the first water cooling module 200 and the third water cooling module 300 are preferably symmetrically arranged on both sides of the second water cooling module 400. The first cold plate 150 and the fourth cold plate 152 are also preferably symmetrically arranged on both sides of the second water cooling module 400. In addition, the first cold plate 150 is preferably arranged between the first water cooling module 200 and the second water cooling module 400, and the fourth cold plate 152 is preferably arranged between the third water cooling module 300 and the second water cooling module 400.

In some embodiments, the first water cooling module 200, the second water cooling module 400 and the third water cooling module 300 can be a water cooling module preferably welded by a plurality of memory cold plates and water collecting chambers made of the stainless steel, aluminum or copper through laser welding without solder to avoid the problem of solder clogging and thermal deformation. In some embodiments, the second cold plates 220 is welded to the second water collector 210 and the third water collector 230 through laser welding to form the first water cooling module 200, without departing from the spirit and scope of the present invention.

In some embodiments, the second cold plates 220, the third cold plates 420, the fifth cold plates 320, the second water collector 210, the third water collector 230, the fifth water collector 430, the fourth water collector 410, the sixth water collector 310 and the seventh water collector 330 may respectively be integrally formed by metal injection molding (MIM) to improve the structural strength thereof and improve the problem of liquid leakage caused by insufficient structural strength of the non-integrated cold plate and water collecting device.

Further referring to FIG. 3, in some embodiments, the first adapter 140 is illustrated as an exemplary embodiment. The first joint 510 of the first adapter 140 preferably includes a flange 610 and a stop surface 620.

The stop surface 620 is disposed in the flange 610, and the second fluid delivery pipeline 130 is connected in the flange 610 by laser welding and positioned on the stop surface 620, and the second joint 520 of the first adapter 140 is welded to the connecting port 550 of the first cold plate 150 by laser welding from the inside or outside. In addition, the inner diameter 601 of the flange 610 is greater than or equal to the outer diameter of the second fluid delivery pipeline 130, and the inner diameter 602 of the connecting port 550 of the first cold plate 150 is greater than or equal to the outer diameter of the second joint 520 of the first adapter 140.

Accordingly, the fluid heat dissipation device may use an adapter to directly connect and communicate the fluid delivery pipelines and cold plates made of different materials without using solder, thereby effectively improving the manufacturing efficiency, product quality and heat dissipation efficiency of the fluid heat dissipation device.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A fluid heat dissipation device, comprising:
- a first cold plate for cooling a first heat source;
- a first adapter connected to the first cold plate;
- a fluid delivery pipeline connected to the first adapter and fluidly communicated with the first cold plate;
- a first joint connected to the fluid delivery pipeline; and
- a second joint connected to the first cold plate, wherein the first joint and the second joint are integrally formed; and
- the second joint is formed by copper metal powders and the first joint is formed by non-copper metal powders.

2. The fluid heat dissipation device of claim 1, wherein the first joint and the fluid delivery pipeline are formed by a same material, and the second joint and the first cold plate are formed by another same material.

3. The fluid heat dissipation device of claim 2, wherein the first joint and the second joint are integrally formed by a metal injection molding process.

4. The fluid heat dissipation device of claim 2, further comprising:
- a first water collector connected to the fluid delivery pipeline; and
- a first fluid delivery pipeline connected to the first water collector.

5. The fluid heat dissipation device of claim 4, further comprising:
- a second adapter connected to the first cold plate, wherein the second adapter is a composite metal adapter; and
- a third fluid delivery pipeline connected to the second adapter.

6. The fluid heat dissipation device of claim 5, further comprising:

a first water cooling module connected to the third fluid delivery pipeline to cool a second heat source, wherein the first water cooling module comprises:

a second water collector connected to the third fluid delivery pipeline;

a third water collector; and a plurality of second cold plates connected in parallel between the second water collector and the third water collector to cool the second heat source.

7. The fluid heat dissipation device of claim 6, further comprising:

a second water cooling module; and a fourth fluid delivery pipeline connected between the second water cooling module and the first water cooling module, wherein the second water cooling module comprises:

a fourth water collector, wherein the fourth fluid delivery pipeline is connected to the fourth water collector and the third water collector;

a fifth water collector; and a plurality of third cold plates connected in parallel between the fourth water collector and the fifth water collector to cool a third heat source.

8. The fluid heat dissipation device of claim 7, further comprising:

a fifth fluid delivery pipeline connected to the fifth water collector.

9. The fluid heat dissipation device of claim 8, further comprising:

a sixth fluid delivery pipeline connected to the first water collector;

a third adapter connected to the sixth fluid delivery pipeline, wherein the third adapter is a composite metal adapter; and a fourth cold plate connected to the third adapter to cool a fourth heat source.

10. The fluid heat dissipation device of claim 9, further comprising:

a fourth adapter connected to the fourth cold plate, wherein the fourth adapter is a composite metal adapter; and a seventh fluid delivery pipeline connected to the fourth adapter.

11. The fluid heat dissipation device of claim 10, further comprising:

a third water cooling module connected to the seventh fluid delivery pipeline, wherein the third water cooling module comprises:

a sixth water collector connected to the seventh fluid delivery pipeline;

a seventh water collector; and a plurality of fifth cold plates connected in parallel between the sixth water collector and the seventh water collector to cool a fifth heat source.

12. The fluid heat dissipation device of claim 11, further comprising:

an eighth fluid delivery pipeline connected to the seventh water collector of the third water cooling module and the fourth water collector of the second water cooling module.

13. The fluid heat dissipation device of claim 1, wherein the first joint of the first adapter, comprising:

a flange; and a stop surface disposed in the flange, wherein the fluid delivery pipeline is welded to the flange through laser welding and positioned on the stop surface, and the first adapter is welded to a connecting port of the first cold plate through laser welding.

14. The fluid heat dissipation device of claim 6, wherein the second cold plates are integrally formed by metal injection molding with metal powders and connected to the second water collector and the third water collector through laser welding.

15. The fluid heat dissipation device of claim 6, wherein each of the second cold plates comprises:

a first end surface;

a second end surface;

a third end surface;

a fourth end surface, wherein the first end surface, the second end surface, the third end surface and the fourth end surface are formed a heat exchange chamber, an inlet and an outlet; and a plurality of partition plates formed in the heat exchange chamber to form a plurality of flowing channels in parallel.

16. The fluid heat dissipation device of claim 1, wherein the first cold plate comprises:

an upper cover; and a lower cover connected to the upper cover through laser welding.

* * * * *